TRANSISTOR AMPLIFIER FOR HIGH SPEED SWEEP

Filed May 2, 1968 3 Sheets-Sheet 1

3,559,085

TRANSISTOR AMPLIFIER FOR HIGH SPEED SWEEP

Yasumori Ishijima, Tokyo, Japan, assignor to Iwatsu Electric Company Limited, Tokyo, Japan, a company of Japan Filed May 2, 1968, Ser. No. 726,066
Claims priority, application Japan, May 4, 1967, 42/28,049
Int. Cl. H03f 3/18, 3/26
U.S. Cl. 330—13 4 Claims

ABSTRACT OF THE DISCLOSURE

An improved transistor push-pull amplifier provided with two output transistors of an opposite polarity type in a common-emitter configuration and having almost equal average DC output levels. By selecting the polarity of the output transistors in accordance with the required polarity of the output voltage, and utilizing the high frequency amplifying characteristics of the output transsistors when they are driven in the direction of their saturation region, the high speed sawtooth waveform of a cathode-ray tube oscilloscope sweep circuit provided with the transistor amplifier of the present invention can be amplified without distortion.

The present invention relates to an improvement of a transistor amplifier for a high speed sweep circuit for producing a linearly increasing sawtooth waveform voltage to generate a horizontal deflection circuit used in an electric instrument such as a cathode-ray tube oscilloscope, etc.

In the transistor amplifier used in a conventional cathode-ray tube oscilloscope sweep circuit, the desired gain is obtained by utilizing a combination of a plurality of transistor push-pull amplifiers in series wherein each amplifier contains transistors of the same polarity type. It is a well known characteristic of the above-mentioned combination of transistor push-pull amplifiers that the output transistors amplify the high speed sawtooth waveform signal with fidelity when the transistors are driven toward the saturation region but lose their high speed characteristics when they are driven toward their cut-off region. Therefore, when the input signal tends to drive the output transistors toward their cut-off region, the output waveform may be considerably delayed, the high frequency amplification characteristics of the amplifier may be degraded, and the output waveform may undergo distortion in spite of wide band and large amplitude characteristics of the amplifier.

The principal object of the present invention is to eliminate the above-mentioned drawbacks of the conventional transistor amplifier for high speed sweep circuits, in other words, to provide an improved transistor push-pull amplifier having excellent high frequency characteristics when driven in large amplitude operation by using output transistors of opposite polarity types.

Figure 1:
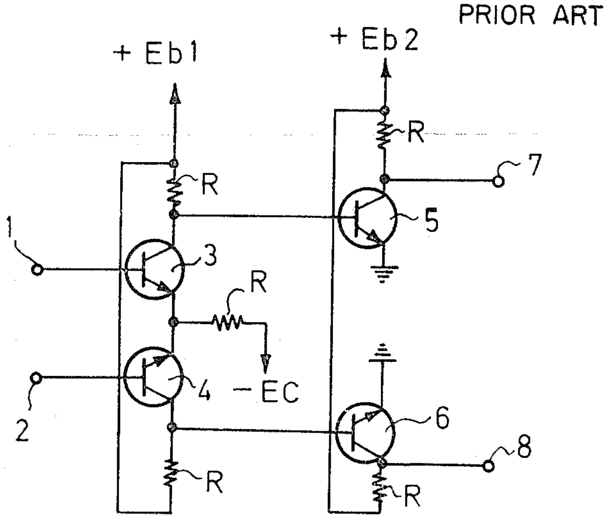
FIG. 1 PRIOR ART
Figure 2:
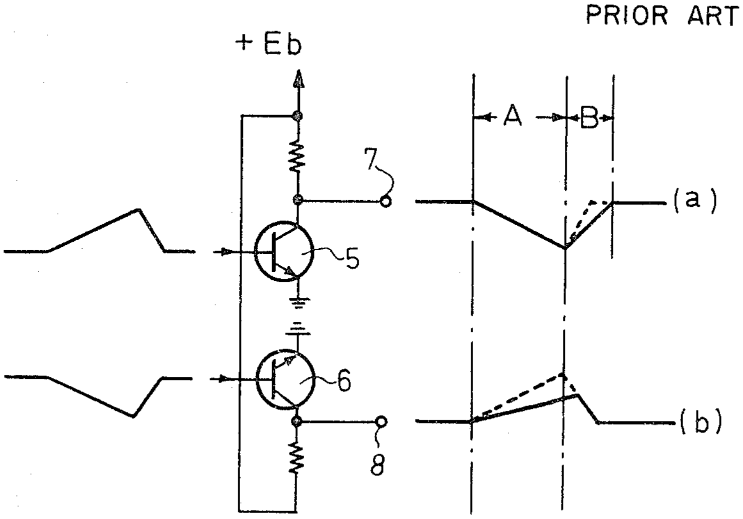
FIG. 2 PRIOR ART
Figure 3:
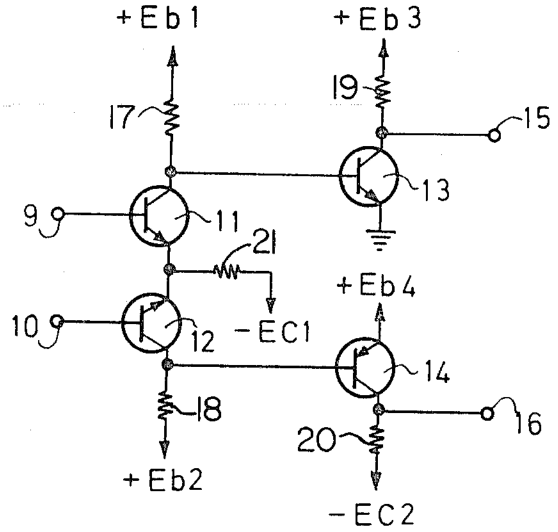
Figure 4:
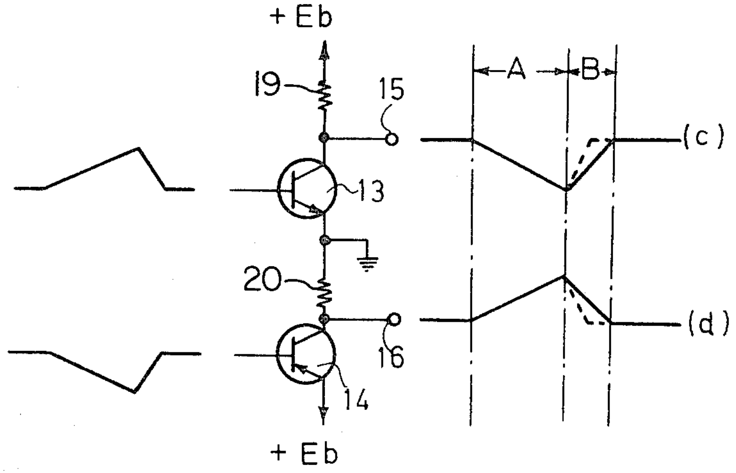

The invention will now be described with reference to the accompanying drawings in which:

FIG. 1 is a circuit diagram of a conventional transistor amplifier used in oscilloscope sweep circuits, FIG. 2 is an explanatory diagram of the performance of the conventional transistor amplifier shown in FIG. 1, FIG. 3 is a circuit diagram of the transistor amplifier of the present invention, FIG. 4 is an explanatory diagram of the performance of the transistor amplifier of the invention shown in FIG. 3, FIGS. 5A to 5D are circuit diagrams of alternate embodiments of the present invention.

Before the detailed description of the present invention, it is useful to explain the operation of a conventional push-pull transistor amplifier shown in FIG. 1 to better understand the present invention. Referring to FIGS. 1 and 2, the sawtooth waveform of the input signals are applied to the input terminals 1 and 2 and amplified by the input transistors. The outputs of the transistors 3 and 4 are applied to the bases of the output transistors 5 and 6 which are connected in a push-pull configuration, and the outputs of transistors 5 and 6 are applied to the horizontal deflection plates of a cathode-ray tube. The conventional transistor amplifier used in the cathode-ray tube oscilloscope obtains the desired gain by utilizing a combination of a plurality of transistor push-pull amplifiers in series, each push-pull pair having transistors of the same polarity type, as shown in FIG. 1. The output signal of the conventional transistor amplifier is shown in FIG. 2, wherein the time interval labeled A represents the sweep period of the sweep circuit during which the amplifier must exhibit a high response speed, and the time interval labeled B represents the hold-off period of the sweep circuit during which a high response speed is not required. The output signal waveform represented by the dotted line would occur if the input signal was amplified with fidelity, the output signal actually has the waveform represented by the solid line. It is clearly shown in FIG. 2, that the output transistors shown in FIG. 1 amplify the input with fidelity, when they are being driven toward saturation, but lose their high response speed when being driven in the direction of cut-off.

Referring to FIG. 3, a circuit diagram of the transistor amplifier of the present invention for a high speed sweep circuit, two input terminals 9 and 10 are connected to the bases of the NPN transistor 11 and NPN transistor 12, respectively. The emitters of both the NPN transistors 11 and 12 are connected through a resistor 21 to a negative voltage source, nominally shown as $-Ec1$ volts. The collector of the NPN transistor 11 is connected through a resistor 17 to a positive voltage source, nominally shown as $+Eb1$ volts. The collector of the NPN transistor 12 is connected through a resistor 18 to a positive voltage source, nominally shown as $+Eb2$ volts. The outputs of both NPN transistors 11 and 12 are connected to the bases of the NPN transistor 13 and the PNP transistor 14, respectively. The collector of the transistor 13 is connected through a resistor 19 to a positive voltage source, nominally shown as $+Eb3$ volts, and the emitter of the transistor 13 is connected to a low voltage source, nominally shown as ground. The collector of the transistor 14 is connected through a resistor 20 to a positive voltage source, nominally shown as $+Eb4$ volts. The output terminals 15 and 16 are connected to the collectors of the NPN transistor 13 and the PNP transistor 14, respectively. The collector of the transistor 13 is connected through a resistor 19 to a positive voltage source, nominally shown as +130 volts, and the emitter of the transistor 13 is connected to a low voltage source, nominally shown as ground. The collector of the transistor 14 is connected through a resistor 20 to a positive voltage source, nominally shown as +115 volts. The output terminals 15 and 16 are connected to the collectors of the NPN transistor 13 and the PNP transistor 14, respectively. In the amplifier described above, the input signals from input terminals 9 and 10 are amplified by transistors 11 and 12. The waveform of these signals, as shown in FIG. 4 are applied to the bases of output transistors 13 and 14. As shown in FIGS. 3 and 4, the collector potential of the transistor 12 is set at a value approximately equal to the maximum positive value of the output signal as shown in (*d*) of FIG. 4. The input signal applied to the input terminal 9 has a negative going sawtooth waveform. When the input signal is amplified by transistor 11, a signal having a positive going sawtooth waveform, as shown in FIG. 4, is impressed on the base of the output transistor 13. An output signal having a negative going sawtooth waveform which varies, for example, from a potential of E*b*3 to the ground potential is obtained at the output terminal 15, as illustrated in (*c*) in FIG. 4. A positive going sawtooth waveform signal is simultaneously applied to the input terminal 10, consequently, a signal having a negative going sawtooth waveform is applied to the base of the output transistor 14. The output of transistor 14 is a signal having a positive going sawtooth waveform which varies from a potential of E*c*2 to a potential of E*b*4 as illustrated in (*d*) of FIG. 4. The average output voltage of the input transistor 11 and the average output voltage of the input transistor are as illustrated in FIG. 4.

Figure 5A:
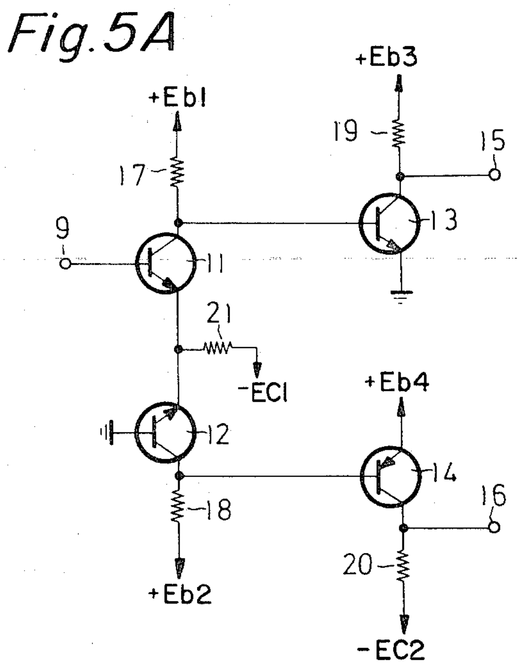
Figure 5B:
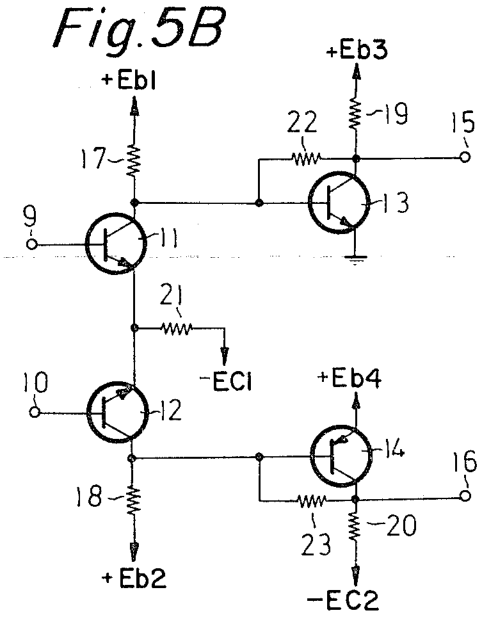
Figure 5C:
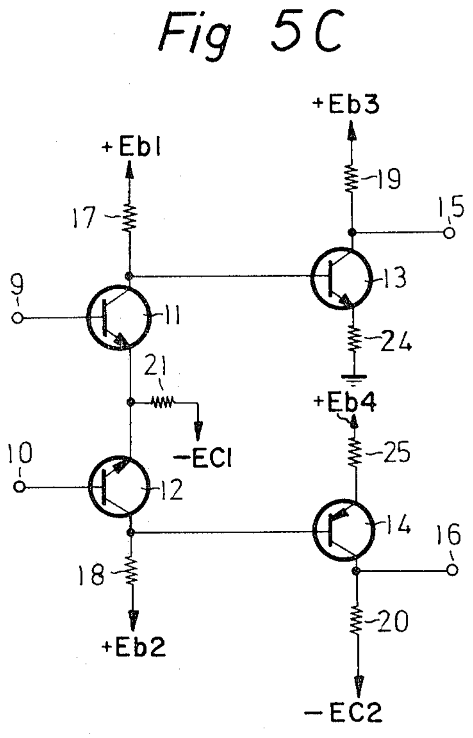
Figure 5D:
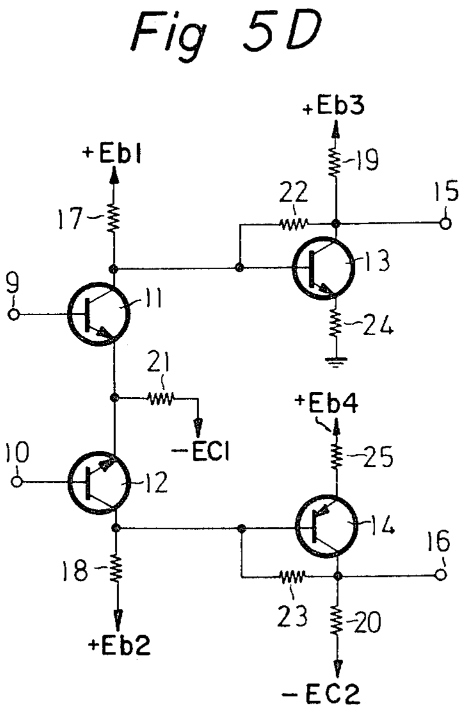

In the above illustration, an embodiment for use with balanced inputs is shown. However, if an unbalanced or single ended input is desired with the same performance characteristics of the above embodiment, it is only necessary to ground the base of transistor 12 and apply an input signal to input terminal 9, as shown in FIG. 5A. Further, the same performance as the first embodiment of the invention can be obtained by applying negative feedback from the collector to the base by resistors 22 and 23, respectively, as shown in FIG. 5B, of the output transistor, or a negative feedback may be provided by inserting impedances, for example, resistors 24 and 25, between the emitter and ground as shown in FIG. 5C, or a combination of the two above-mentioned techniques, as shown in FIG. 5B.

As mentioned above, by selecting the type of junction of the output transistors 13 and 14 in accordance with the required polarity of the output voltage, and utilizing the high response speed characteristic of the amplifier when the transistors are being driven toward saturation, a high speed signal having a sawtooth waveform in a cathode-ray tube oscilloscope sweep circuit provided with the transistor amplifier of the present invention can be amplified without distortion.

While the invention has been described in conjunction with certain embodiments thereof, it is to be understood that various modifications and changes may be made without departing from the spirit and scope of the invention.

What is claimed is:

1. A transistor DC amplifier for producing high speed sawtooth waveform voltages comprising, an amplifying circuit having two amplifying input transistors of a same polarity type, for each input transistor an input terminal connected to the base thereof, means for connecting the emitters of the input transistors in common to a same voltage source, means comprising connections including load resistors connected to the collectors of the input transistors individually and separately for unsymmetrically biasing the input transistors during operation, two output junction transistors of two different junction types and different polarity types, connections from the collectors of the input transistors to a respective base of the output transistors, means comprising connections connected to the emitters of the output transistors individually and separately for biasing unsymmetrically the emitters in operation by applying thereto different voltages, means comprising connections including load resistors connected to the collectors of said output transistors individually and separately for biasing the output transistors unsymmetrically by applying in operation to the last-mentioned connections different voltages, for each output transistor an output terminal connected to the collector thereof for taking out voltage outputs of substantially equal values.

2. A transistor DC amplifier according to claim 1, wherein each of said output transistors is provided with a negative feedback from its collector to its base.

3. A transistor DC amplifier according to claim 1, wherein each of said output transistors is provided with a negative feedback comprising an impedance connected in its emitter circuit.

4. A transistor DC amplifier according to claim 1, wherein each of said output transistors is provided with a combination of a first feedback from its collector to its base with a second feedback comprising an impedance connected in its emitter circuit.

References Cited

UNITED STATES PATENTS

| | | | |
|---|---|---|---|
| 2,782,267 | 2/1957 | Beck | 330—13 |
| 2,791,645 | 5/1957 | Bessey | 330—13 |
| 3,346,818 | 10/1967 | Price | 330—15X |

JOHN KOMINSKI, Primary Examiner

S. H. GRIMM, Assistant Examiner

U.S. Cl. X.R.

315—26; 330—15, 17, 19, 28